US006320189B1

United States Patent
Ouvrier-Buffet et al.

(12)

(10) Patent No.: US 6,320,189 B1
(45) Date of Patent: Nov. 20, 2001

(54) DEVICE FOR THE DETECTION OF MULTISPECTRAL INFRARED/VISIBLE RADIATION

(75) Inventors: Jean-Louis Ouvrier-Buffet, Sevrier; Chantal Beccia, Eybens; Michel Vilain, St Georges de Commiers, all of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/352,232

(22) Filed: Jul. 13, 1999

(30) Foreign Application Priority Data

Jul. 28, 1998 (FR) ................................................ 98 09645

(51) Int. Cl.⁷ ................................................ H01L 27/142
(52) U.S. Cl. ...................... 250/338.4; 250/332; 250/330
(58) Field of Search .................................. 250/332, 330, 250/338.4

(56) References Cited

U.S. PATENT DOCUMENTS

| 4,651,001 | 3/1987 | Harada et al. . |
| 5,286,976 | 2/1994 | Cole . |
| 5,288,649 | 2/1994 | Keenan . |
| 5,451,786 | * 9/1995 | Kosai ................................ 250/338.4 |
| 5,818,051 | * 10/1998 | Dreiske et al. ................... 250/338.4 |

FOREIGN PATENT DOCUMENTS

| 354 369 | 2/1990 | (EP) . |
| 928 031 A1 | 7/1999 | (EP) . |
| 2 752 299 | 2/1998 | (FR) . |

OTHER PUBLICATIONS

Patent Abstracts of Japan, Publication No. 61115355, Feb. 6, 1986.
WO 97/18589 May 22, 1997.
Photonic Products Preview, IR/VIS Light Surveillance system Finds Applications in Defence, Security, EuroPhotonics, Dec./Jan. 1998.

* cited by examiner

Primary Examiner—Constantine Hannaher
Assistant Examiner—Andrew Israel
(74) Attorney, Agent, or Firm—Pearne & Gordon LLP

(57) ABSTRACT

A device for the detection of multi-spectral infrared and visible radiation using a bolometric detector having at least one active layer and two control electrodes for the detection of both infrared and visible radiation, and also using at least one photodetector having at least two active layers and two control electrodes for detecting solely visible radiation. The device is uncooled, and the two detectors are superimposed and combined with one-another for forming the same sensitive element.

16 Claims, 2 Drawing Sheets

DEVICE FOR THE DETECTION OF MULTISPECTRAL INFRARED/VISIBLE RADIATION

FIELD OF THE INVENTION

The invention relates to a device for detecting multispectral infrared/visible radiation with a space coherence or even a space-time coherence in certain embodiments.

It is used in the field of the recognition of objects or persons and in the surveillance field.

PRIOR ART

In the recognition and surveillance fields, numerous detector types can be used as a function of the radiation type to be detected.

In particular, for the detection of visible radiation, it is standard practice to use photoelectric detectors produced from semiconductor materials, whose photoelectric properties make it possible to convert visible radiation into electrical signals. Thus, the illumination by a visible radiation generates, within the semiconductor materials, a number of carriers proportional to the absorbed light energy. The most widely used visible detectors are of the photovoltaic type and are e.g. pn, pin, avalanche or SCHOTTKY photodiodes or alternatively phototransistors. The electric charges from these detectors are then collected, stored and processed by multiplexing devices, or reading devices of the CCD or CMOS type.

Moreover, for the detection of infrared (IR) radiation, it is standard practice to use uncooled, thermal detectors. These detectors generally comprise one or more sensitive elements, which can be heated by an infrared radiation in the III band (8 to 12 $\mu$m), characteristic of the temperature and the emissivity of the bodies observed.

Thus, the temperature rise of a sensitive element produces a variation of one of the electrical properties of the sensitive material: appearance of electric charges by the pyroelectric effect or variation of the capacitance by a change of the dielectric constant or a variation of the resistance of a semiconductor or metallic material.

However, for such detectors to have good performance characteristics, it is necessary for the sensitive material to have a low calorific mass, a good thermal insulation of the active layer relative to its support, which requires the formation of a microbridge and a high sensitivity of the effect of converting the heating into an electrical signal.

Only thin film detectors satisfy these conditions and in particular bolometric thermal detectors, such as those described in patent application FR-A-2 752 299 and the patent application filed under No. 97 16791. Metallic bolometric detectors are generally made from nickel (Ni), titanium (Ti), titanium nitride (TiN) or platinum (Pt).

Such detectors can be connected in array form to a silicon multiplexing circuit of the CMOS or CCD type (also known as a reading circuit) in order to implement monolithic infrared imagers operating at ambient temperature.

An example of a microbridge bolometric detector (reference 28) on a multiplexing circuit is shown in FIG. 1. The CMOS or CCD-type multiplexing circuit carries the reference 1 and the microbridge the reference 4. Said microbridge 4 comprises supports 5 supporting active elements of the microbridge and the connections of said active elements to the multiplexing circuit 1 by metal connections 6 incorporated into an insulating material layer 2 covering the multiplexing circuit 1. The active elements of the microbridge 4 are a layer of material sensitive to IR radiation designated 9 and electrodes 7 extended by thermal insulation arms 8. A reflector 3 is placed beneath the microbridge for reflecting the IR radiation towards the sensitive material 9.

For the detection of multispectral radiation detection devices exist which are combined or grouped in the form of strips or mosaics. In such devices, detectors of a first radiation type are associated with detectors of a second radiation type, being juxtaposed or adjacent to one another in the same plane or in different planes, or are strictly superimposed.

The most widespread superimposed multispectral systems in the infrared detection field are implemented from a stack of epitaxial layers of $Cd_xHg_{1-x}Te$ having different compositions, which are themselves epitaxied on an infrared radiation-transparent substrate. The spectral absorption bands are determined by the composition x of the detecting layers. These detectors are of the photovoltaic type and operate at low temperature in a wavelength range between 1 and 12 $\mu$m, i.e. outside the visible radiation spectrum. Thus, such systems do not permit the simultaneous detection of IR and visible radiation.

In the infrared/visible radiation field, the most widespread multispectral detection systems are implemented on the basis of two cameras, which scan the spectral bands, respectively of the infrared and the visible, as described in the article "IR/VIS Light Surveillance System Finds—Applications in Defense, Security", EUROPHOTONICS, Dec./Jan. 1998. In such a system, the infrared camera is constituted by cooled detectors, made from InSb or $Cd_xHg_{1-x}Te$ and operating in bands II and III. The visible camera is e.g. implemented on the basis of a CCD-type component.

Other multispectral detection systems consist of a juxtaposing of $Cd_xHg_{1-x}Te$, cooled, infrared (IR) detectors and silicon, visible (VIS) detectors. The radiation from the scene observed is then split by an external device into two beams, which are then focussed onto each type of detector.

In such a system, the visible detectors operate at ambient temperature and the infrared detectors operate in the cold. Therefore, such systems are costly and complex.

DESCRIPTION OF THE INVENTION

The invention aims at obviating the disadvantages of the procedures described hereinbefore.

To this end, it proposes a multispectral infrared/visible detection device using simple, uncooled, thermal, photoelectric detectors, which are approximately superimposed and which can have one or more electrodes and/or a common active layer, which ensures a space (or in certain cases a space-time) coherence of the detection and prevents a complex, costly detector cooling.

More specifically, the invention relates to a multispectral infrared/visible radiation detection device comprising:

at least one bolometric detector having at least one active layer and two control electrodes and ensuring the detection of IR and visible radiation and at least one photoelectric detector having at least two active layers and two control electrodes and solely ensuring the detection of visible radiation. An electronic processing of the results of the two detections then makes it possible to access the infrared component of the incident radiation.

The bolometric detector and the photoelectric detector are characterized in that they are of the uncooled type and are superimposed and combined with one another in order to constitute the same sensitive element.

In the device according to the invention, the sensitive element has a microbridge connected to a multiplexing circuit via supporting and connecting means.

According to a first embodiment, the microbridge incorporates the active layers of the bolometric detector and photoelectric detector, as well as their control electrodes.

In this embodiment, the bolometric detector and the photoelectric detector can have at least one common control electrode.

According to a variant of the invention, the active layers of the photoelectric detector form a photodiode having a lower electrode and an upper electrode, the latter also constituting one of the electrodes of the bolometric detector. In this case, the device has a type $P^+$ a-Si:H layer common to the two detectors, the photoelectric detector also having an intrinsic a-Si:H layer and a type $N^+$ a-Si:H layer.

According to another variant of the invention, the active layers of the photoelectric detector form an insulated photodiode. In this case, the bolometric detector active layer is of type $P^+/N^+$ a-Si:H or of VOx/metal and the photoelectric detector active layers are of type $P^+$ a-Si:H, intrinsic a-Si:H and type $N^+$ a-Si:H.

According to yet another variant, the active layers of the photoelectric detector form a phototransistor. In this case, the active layers of the photoelectric detector and the bolometric detector are of a-Si:H with different doping levels.

According to another embodiment of the invention, the microbridge has active layers and the control electrodes of the bolometric detector and the photoelectric detector is placed beneath the microbridge facing the bolometric detector.

In this embodiment, at least part of the microbridge is made from materials transparent to visible radiation or has one or more holes ensuring the passage of visible radiation through the microbridge.

In this embodiment, the device according to the invention can incorporate a reflector placed beneath the microbridge, above the addressing circuit and made from a material reflecting infrared radiation and transparent to visible radiation.

In this embodiment, the photoelectric detector can be integrated into the multiplexing circuit.

According to yet another embodiment, the microbridge has the active layers and electrodes of the bolometric detector which forms, on the multiplexing circuit, reticulation zones in which the photoelectric detector is inserted.

No matter which embodiment is involved, the device can have a plurality of identical, sensitive elements, which are joined to one another for forming an array of sensitive elements.

DETAILED DESCRIPTION OF EMBODIMENTS OF THE INVENTION

The invention relates to a multispectral infrared/visible radiation detection type using a photoelectric detector and a bolometric detector arranged in superimposed manner and both of the uncooled type. This device can be implemented according to several embodiments.

Figure 1:
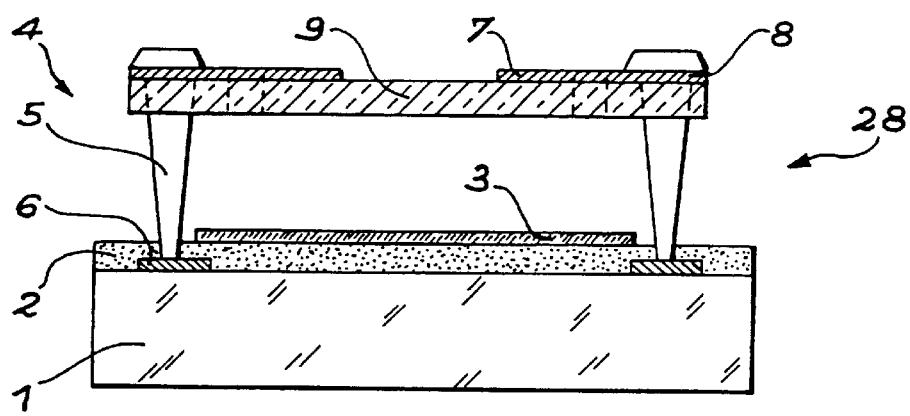
FIG. 1, already described, shows a conventional microbridge bolometric detector.
Figure 2:
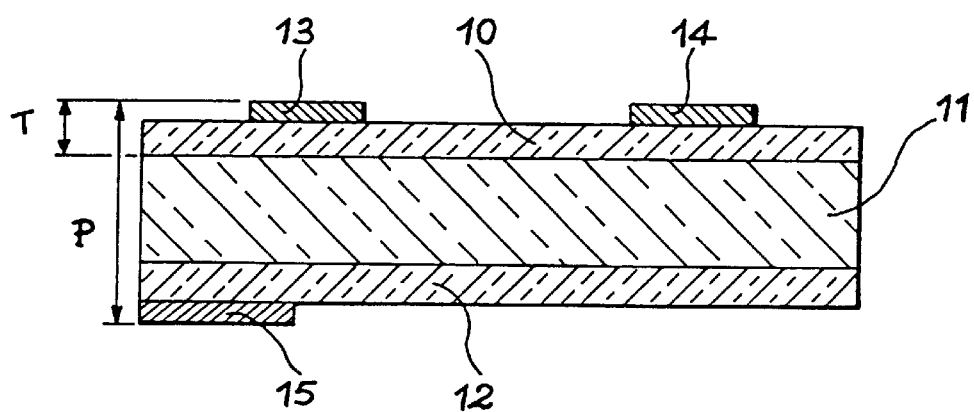
FIG. 2 shows the active part of the microbridge of the device of the invention according to a first embodiment.

A first embodiment of such a device is shown in FIG. 2. More specifically, FIG. 2 shows the active part of the microbridge of the device according to the invention, said part having both the means necessary for photoelectric detection and the means necessary for thermal detection. This active part of the microbridge shown in FIG. 2, compared with the conventional bolometric detector of FIG. 1, replaces elements 7 and 9 in the latter.

This active part has three sensitive material layers:

a type $P^+$ a-Si:H or a-SiC:H layer 10 constituting both the sensitive layer of the bolometric detector and one of the sensitive layers of the photoelectric detector, a a-Si:H or a-SiGe:H layer 11 constituting the intrinsic layer of the photoelectric detector and a type $N^+$ a-Si:H or a-SiC:H layer 12 constituting the third layer of the photoelectric detector.

The three sensitive material layers 10, 11 and 12 are all three used for photoelectric detection, whilst only the layer 10 is used for thermal detection.

References 13, 14 and 15 represent three electrodes, the upper electrodes 13 and 14 belonging to the thermal detection part T in FIG. 2 and electrode 15 is one of the electrodes of the photoelectric detector designated P.

Thus, during a first phase, the IR/VIS detector functions as a bolometer. Thus, only the upper electrodes 13 and 14 are biassed, whereas the lower electrode 15 is not connected. As the highly doped materials of layers 10 and 12 have little or no photoconductive effect under visible illumination, the measurement of the resistor constituted by the group of three layers reveals the heating of the microbridge and measures the total incident radiation (IR+visible).

During a second measuring phase, the IR/VIS detector functions as a photoelectric detector. The upper electrodes 13 and 14 are short-circuited and can constitute an earth. The layers 10, 11, 12 then constitute a biassed $P^+IN^+$ photodiode with the electrodes 13 and 14 earthed and electrode 15 as the control electrode. This photodiode ensures the detection of the visible radiation. For example, the measurement of the open circuit voltage gives the image of the photon flux and does not produce heating of the device through the input resistors.

In exemplified manner, it is pointed out that the layers 10 and 12 have a thickness between 0.01 and 1 μm and the intrinsic layer 11 a thickness between 0.05 and 0.5 μm.

The detection device described hereinbefore ensures a space coherence of the detection of the multispectral radiation.

Figure 3:
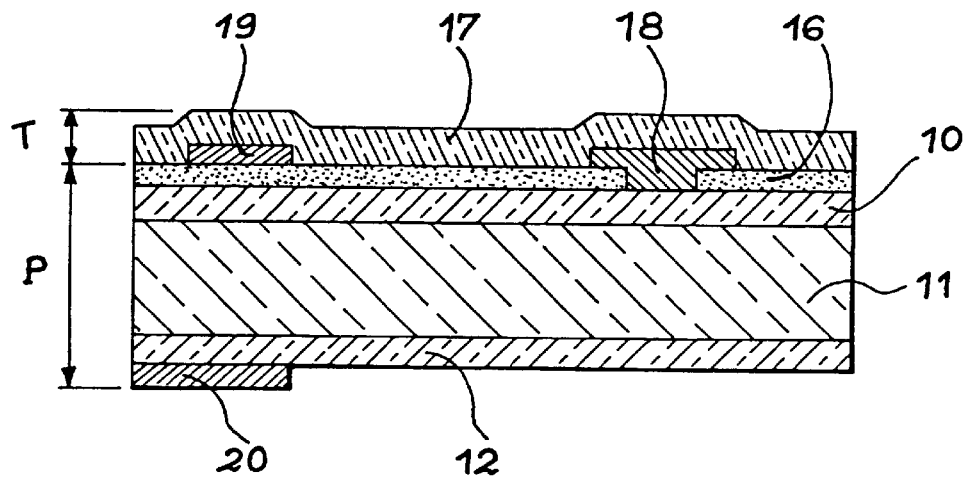
FIG. 3 shows the active part of the microbridge of the device of the invention according to a second embodiment.

FIG. 3 shows a second embodiment of the device according to the invention in which the thermal detection and photoelectric detection take place in the microbridge.

According to this embodiment, the active part of the microbridge has three sensitive element layers 10, 11, 12 identical to those shown in FIG. 2, together with an insulating layer 16 and a fourth, sensitive layer 17 of type $P^+$ or $N^+$ a-Si:H or of Vox or metal.

In this embodiment, the sensitive layer 17 only ensures the thermal detection. Layers 10, 11, 12 and the insulating layer 16 implement an insulated photodiode permitting the photoelectric detection. This insulating material layer 16 consequently ensures the separation between the active layer of the thermal detection part T and the photoelectric detection part P. In this embodiment, the microbridge also has three electrodes 18, 19, 20. Electrode 19 is an electrode which is specific to the thermal detection, i.e. an electrode specific to the bolometer, and the electrode 20 is an electrode specific to the photodiode implementing the photoelectric detector. Electrode 18 is common to the two detectors and is partly positioned on the insulating layer 16, but is also partly in contact with the sensitive layer 10.

The detector obtained using such an active part in the microbridge has the advantage of bringing about a space-time coherence of the detection of the multispectral radiation with only three interconnection elements, i.e. three electrodes, because the electrode 18 is common to the two detection types. In other words, the detection of the multispectral radiation takes place simultaneously for the visible radiation and the infrared radiation and in the same sensitive element, i.e. in the same space.

Figure 4:
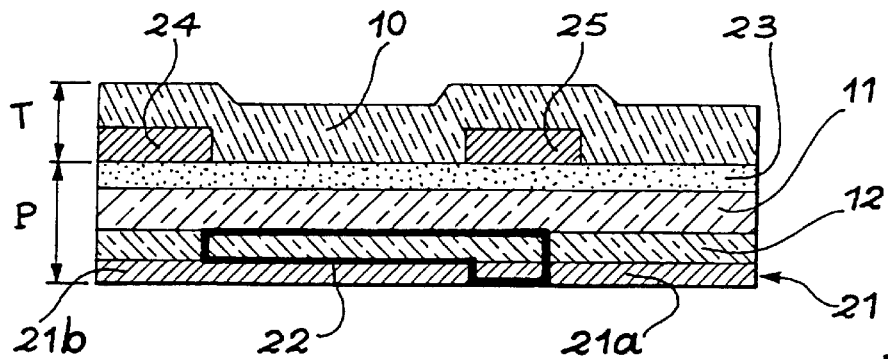
FIG. 4 shows the active part of the microbridge of the device of the invention according to a third embodiment.

FIG. 4 diagrammatically shows the active part of the microbridge according to a third embodiment of the invention. According to this embodiment, the infrared/visible detector has a thermal detection part T constituted by a sensitive layer 10 and electrodes 24, 25 and a photoelectric detection part P.

As in the previous embodiments, the photoelectric detection part P has an a-Si:H layer 11 and a type $N^+$ a-Si:H or a-SiC:H active layer 12. According to this embodiment, the photoelectric detection part constitutes a phototransistor, which has a source-drain insulator 22 and a metal layer 21 implementing on the one hand the metallization 21a of the drain and on the other the metallization 21b of the source, which constitutes two of the terminals of the phototransistor. The phototransistor also has an insulating material layer 23 forming the insulator of the phototransistor gate. The thermal detection part is placed above said gate insulator 23. It has a layer 10, within which are positioned two electrodes, namely an electrode 24, which is one of the bolometer electrodes and an electrode 25 constituting on the one hand the second bolometer electrode and on the other the phototransistor gate. Thus, as in the embodiment of FIG. 3, the photoelectric detection part P and the thermal detection part T have an electrode in common, namely the electrode 25.

During the thermal detection phase only the upper electrodes 24 and 25 are biassed. They form with the semiconductor layer 10 a resistor able to measure the temperature of the "bolometric plate". The source and drain metallizations 21b, 21a are not connected. Thus, the previously made remark concerning the photoconductivity of the highly doped materials remains valid.

During the photoelectric detection phase, the upper electrodes 25 and 24 are raised to the same potential. Electrode 25 serves as a gate for the phototransistor. The source and drain metallizations 21b, 21a are then connected to their supplies. As the current flow through the transistor can heat the device, the thermal detection takes place after the latter has returned to thermal equilibrium.

By connecting the phototransistor drain to the bolometric resistor electrode 25, which also constitutes the phototransistor gate, the operation of such a visible/infrared radiation detector only requires three supply elements 24, 25 and 22.

Figure 5:
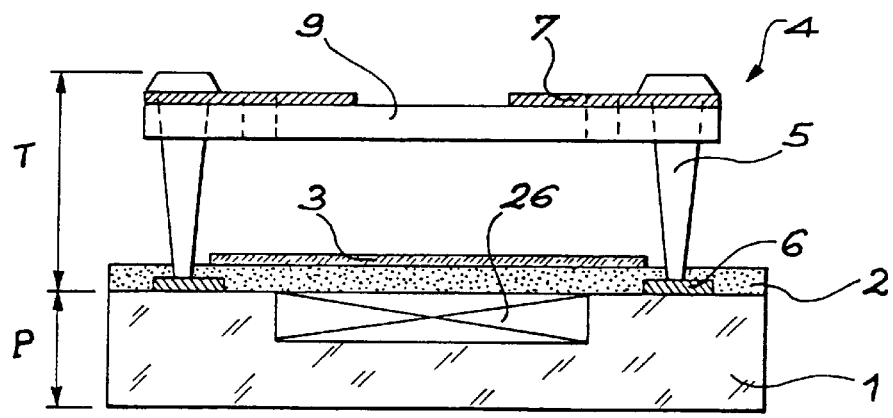
FIG. 5 shows a multispectral IR/VIS detector of the invention according to a fourth embodiment.
Figure 6:
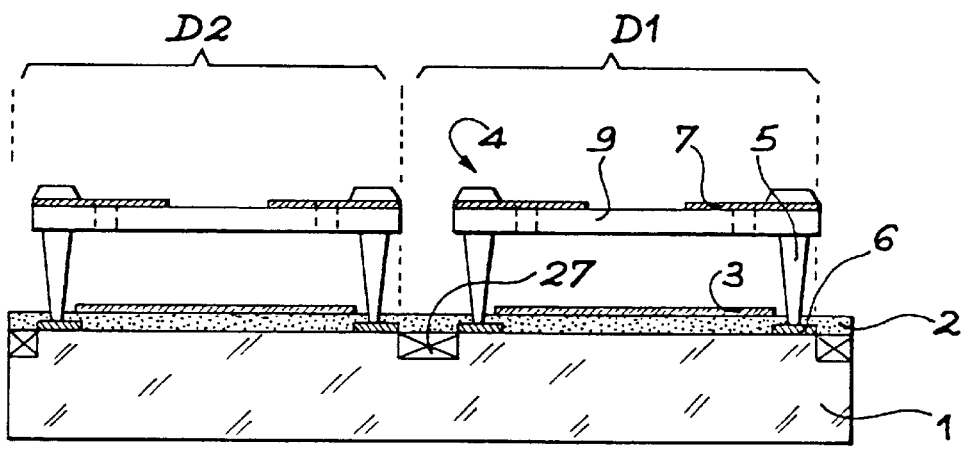
FIG. 6 shows an array of two multispectral IR/VIS detectors of the invention according to a fifth embodiment.

FIGS. 5 and 6 show two other embodiments of the invention, in which the thermal detection part T is placed in the detector microbridge and the photoelectric detection part P is placed on the multiplexing circuit.

Thus, FIG. 5 shows a fourth embodiment of the invention, in which the thermal detection part T is placed in the microbridge 4 and the photoelectric detection part P is placed on the multiplexing circuit 1 beneath the microbridge. In other words, in this embodiment, thermal detection takes place at the microbridge 4 in conventional manner, whereas photoelectric detection takes place at the multiplexing circuit or CMOS or CCD reading circuit, by means of a photodiode or a phototransistor 26, located beneath the microbridge. In other words, in FIG. 5 there is the same microbridge 4 as in FIG. 1 with its supports 5, its contact zones 6, its electrodes 7 and its sensitive layer 9. This microbridge 4 is connected to the multiplexing circuit 1 covered with an insulating layer 2. A reflector 3 is responsible for the reflection of the infrared radiation to the sensitive layer 9.

This infrared/visible detector according to the invention also has a photodiode or phototransistor 26 in FIG. 5, which ensures the photoelectric detection. In addition, so that said photodiode or phototransistor 26 can detect the visible radiation, the microbridge is at least partly transparent to visible radiation, which means that the sensitive layer 9 and electrodes 7 are transparent to visible radiation. For this purpose, said sensitive layer 9 and/or the electrodes 7 can have one or more holes to permit the passage of the visible radiation. This variant is suitable when the microbridge is made from materials which absorb as a result of their nature or their thickness. The holes made in the microbridge may only apply to the effectively absorbing layers. According to another variant, the microbridge can be made from a transparent material or from a material with a very limited thickness, so as to be transparent and weakly absorbing.

In this embodiment, the reflector 3 is made from a material ensuring on the one hand the reflection of the infrared radiation to the sensitive layer 9 and on the other the transparency for the visible radiation having to reach the photodiode or phototransistor 26. This reflector 3 can be made from transparent, conductive oxides, such as ZnO, $SnO_2$, ITO (indium tin oxide) and can then be optimized on the one hand so as to reflect the maximum of infrared radiation in the 8–12 $\mu$m band (reflectance higher than 90%) and on the other so as to have a maximum transparency for visible radiation.

As for the microbridge, the reflector 3 can also be made transparent to the visible radiation by means of holes.

FIG. 6 shows a fifth embodiment of the invention in which the thermal detection part is located in the microbridge and the photoelectric detection part is located on the multiplexing circuit on the border of the microbridge.

FIG. 6 shows a multiplexing circuit 1 to which are connected two detectors D1 and D2 according to the invention. Only the visible/infrared detector D2 will now be described, because detector D1 is strictly identical to D2.

As can be seen in FIG. 6, the thermal detection part is identical to a conventional bolometric detector, as shown in FIG. 1, with respect to the microbridge 4, connection 5, 6 of the microbridge to the multiplexing circuit 1 and the reflector 3. However, the infrared/visible detector according to the invention has a photoelectric detection part 27, which can be a photodiode or phototransistor, which is positioned in the location freed by the reticulation of the thermal detection part, i.e. the bolometric detector, on the multiplexing circuit 1. As the photoelectric detection part 27 is in the reticulation of the thermal detection part, said two detection parts are located in the same sensitive element. In other words, said assembly constitutes a same elementary point, although the photoelectric detection part is displaced by a few dozen microns with respect to the thermal detection part. As the detection of the two spectra takes place in the same elementary point, it is considered that the detection takes place with a space coherence.

The embodiment shown in FIG. 6 has the advantage of being easy to implement, because the photoelectric detector is not strictly placed within the thermal detector.

No matter what the embodiment of the invention, several infrared/visible detectors can be combined and placed on the same multiplexing circuit (as shown in FIG. 6 with the two detectors D1 and D2) thus implementing an array of sensitive elements. Such an array-type architecture has numerous applications and can in particular be used in infrared and visible imaging.

The use of thin film microstructures, as described by means of the various embodiments of the invention, makes it possible to implement an efficient thermal insulation of the array of sensitive elements with respect to the multiplexing circuit. These microstructures can be produced according to various processes, which necessarily lead to the production of microbridges, namely by underetching the silicon substrate beneath the sensitive elements, the insulator and in part the substrate or on the basis of a sacrificial layer, typically of polyimide, on which are produced the sensitive elements.

As these production methods are known to the expert and are in particular described in FR-A-2 752 299, they will not be described in greater detail here.

However, it should be noted that the thin layers or films of elements (layers with thicknesses between 0.005 and 1 um) made from insulating material (SiN, SiO, ZnS, etc.) or polycrystalline or amorphous semiconductor material (Si, Ge, SiC, a-Si:H, a-SiC:H, a-SiGe:H, etc.) are obtained by low temperature deposition methods conventionally used for such materials, namely cathodic sputtering, thermal decomposition or plasma decomposition. The optional doping of these layers takes place by introducing into the reactor a doping gas, such as $BF_3$ or $PH_3$ or by ion implantation. Etching of these materials generally takes place by plasma etching processes.

The metallic materials (Ti, TiN, Pt, Al, Pd, Ni, NiCr, etc.) constituting the resistive elements, electrodes and various metallizations of the detector according to the invention are also deposited by cathodic sputtering or thermal or plasma decomposition.

For optimization reasons, the equivalent square resistance of the layers constituting the electrodes will be adapted to the impedance of the vacuum. The distance between the electrodes and the reflector is also adapted so as to implement a quarter-wave cavity leading to maximum absorption at the sought wavelength.

The photoelectric detector can also be adapted to the sought wavelength range: visible range, UV range or X-ray range.

What is claimed is:

1. Device for the detection of multispectral infrared/visible radiation comprising:
    at least one bolometric detector (I) having at least one active layer (10) and two control electrodes and ensuring the detection of IR and visible radiation and
    at least one photoelectric detector (V) having at least two active layers (11, 12) and two control electrodes and solely ensuring the detection of visible radiation,
characterized in that the bolometric detector and the photoelectric detector are of the uncooled type and that they are superimposed and combined with one another to form the same sensitive element.

2. Device according to claim 1, wherein the sensitive element comprises a microbridge (4) connected to a multiplexing circuit (1) by support and connection means (5, 6, 8), characterized in that the microbridge incorporates active layers of the bolometric detector and the photoelectric detector (10, 11, 12), as well as their control electrodes (13, 14, 15).

3. Device according to claim 2, characterized in that the bolometric detector and the photoelectric detector have at least one common control electrode (14).

4. Device according to claim 2, characterized in that the active layers (10, 11, 12) of the photoelectric detector form a photodiode having a lower electrode (15) and an upper electrode (14), the latter also constituting one of the electrodes of the bolometric detector.

5. Device according to claim 4, characterized in that it has a type $P^+$ a-Si:H layer common to the two detectors, the photoelectric detector also having an intrinsic a-Si:H layer and a type $N^+$ a-Si:H layer.

6. Device according to claim 3, characterized in that the active layers (11, 12, 16) of the photoelectric detector form an insulated photodiode.

7. Device according to claim 6, characterized in that the active layer (10) of the bolometric detector is of type $P^+$ or $N^+$ a-Si:H or Vox or metal and the active layers of the photosensitive detector are of type $P^+$ a-Si:H, intrinsic a-Si:H and type $N^+$ a-Si:H.

8. Device according to claim 3, characterized in that the active layers (11, 12, 23) of the photoelectric detector form a phototransistor.

9. Device according to claim 8, characterized in that the active layers of the photoelectric detector and the bolometric detector are of a-Si:H with different doping levels.

10. Device according to claim 1, in which the sensitive element incorporates a microbridge (4) connected to a multiplexing circuit (1) by support and connection means (5, 6, 8), characterized in that the microbridge incorporates the active layer (9) and the bolometric detector control electrode (7) and in that the photoelectric detector (26) is placed beneath the microbridge facing the bolometric detector.

11. Device according to claim 10, characterized in that at least part of the microbridge is made from materials transparent to visible radiation.

12. Device according to claim 10, characterized in that the active layer and/or the electrodes of the bolometric detector have one or more holes ensuring the passage of visible radiation through the microbridge.

13. Device according to claim 10, in which the sensitive element has a reflector (3) placed beneath the microbridge and above the addressing circuit, characterized in that said reflector is made from a material reflecting infrared radiation and transparent to visible radiation.

14. Device according to claim 10, characterized in that the photoelectric detector is integrated into the multiplexing circuit.

15. Device according to claim 1, in which the sensitive element incorporates a microbridge (4) connected to a multiplexing circuit (1) by support and connection means (5, 6, 8), characterized in that the microbridge incorporates the active layer (9) and the electrodes (7) of the bolometric detector which forms, on the multiplexing circuit (1), reticulation zones, in which is inserted the photoelectric detector (27).

16. Device according to claim 1, characterized in that it has a plurality of identical, sensitive elements, joined to one another in order to form an array of sensitive elements.

* * * * *